(12) United States Patent
Sato et al.

(10) Patent No.: US 10,993,322 B2
(45) Date of Patent: Apr. 27, 2021

(54) CIRCUIT BOARD, LAMINATED CIRCUIT BOARD, AND METHOD OF MANUFACTURING CIRCUIT BOARD

(71) Applicant: SHINKO ELECTRIC INDUSTRIES CO., LTD., Nagano (JP)

(72) Inventors: Keigo Sato, Nagano (JP); Hiroshi Taneda, Nagano (JP); Noriyoshi Shimizu, Nagano (JP)

(73) Assignee: SHINKO ELECTRIC INDUSTRIES CO., LTD., Nagano (JP)

(*) Notice: Subject to any disclaimer, the term of this patent is extended or adjusted under 35 U.S.C. 154(b) by 0 days.

(21) Appl. No.: 16/852,924

(22) Filed: Apr. 20, 2020

(65) Prior Publication Data
US 2020/0344879 A1    Oct. 29, 2020

(30) Foreign Application Priority Data
Apr. 25, 2019 (JP) .............. JP2019-084696

(51) Int. Cl.
| | |
|---|---|
| H05K 1/11 | (2006.01) |
| H05K 1/02 | (2006.01) |
| H05K 1/09 | (2006.01) |
| H05K 3/46 | (2006.01) |
| H05K 3/42 | (2006.01) |
| H05K 3/00 | (2006.01) |
| H05K 3/02 | (2006.01) |

(52) U.S. Cl.
CPC ............ *H05K 1/113* (2013.01); *H05K 3/007* (2013.01); *H05K 3/027* (2013.01); *H05K 3/424* (2013.01); *H05K 3/4611* (2013.01); *H05K 1/0284* (2013.01); *H05K 1/0298* (2013.01); *H05K 1/09* (2013.01); *H05K 2203/0723* (2013.01)

(58) Field of Classification Search
CPC ........ H05K 1/113; H05K 3/424; H05K 3/007; H05K 3/027; H05K 3/4611; H05K 2203/0723
See application file for complete search history.

(56) References Cited

U.S. PATENT DOCUMENTS

| | | | | |
|---|---|---|---|---|
| 6,759,599 | B2* | 7/2004 | Tatoh | H01L 21/4846 |
| | | | | 174/255 |
| 9,210,807 | B2* | 12/2015 | Imafuji | H05K 1/111 |
| 2010/0132995 | A1* | 6/2010 | Kaneko | H01L 21/6835 |
| | | | | 174/261 |
| 2018/0090461 | A1* | 3/2018 | Tanaka | H01L 23/49548 |

FOREIGN PATENT DOCUMENTS

JP    2016-149517    8/2016

* cited by examiner

*Primary Examiner* — Ishwarbhai B Patel
(74) *Attorney, Agent, or Firm* — Rankin, Hill & Clark LLP

(57) ABSTRACT

A circuit board includes: an insulating layer having at least a part formed of an insulating resin; and an electrode pad embedded in the insulating layer and having a neck formed on an outer side surface, the neck being held in contact with the insulating resin of the insulating layer. The electrode pad includes: a first conductor layer having an end surface exposed from one surface of the insulating layer; and a second conductor layer formed on the first conductor layer and having a grain boundary density different from a grain boundary density of the first conductor layer. The neck is formed in a region of the outer side surface, the region corresponding to a boundary part between the first conductor layer and the second conductor layer.

6 Claims, 18 Drawing Sheets

CIRCUIT BOARD, LAMINATED CIRCUIT BOARD, AND METHOD OF MANUFACTURING CIRCUIT BOARD

CROSS-REFERENCE TO RELATED APPLICATION

This application is based upon and claims the benefit of priority of the prior Japanese Patent Application No. 2019-084696, filed on Apr. 25, 2019, the entire contents of which are incorporated herein by reference.

FIELD

The embodiment discussed herein is related to a circuit board, a laminated circuit board, and a method of manufacturing a circuit board.

BACKGROUND

Hitherto, there has been known a circuit board obtained by laminating insulating layers having wiring lines formed in an insulating resin. In such circuit board, for example, a metal electrode pad that is connected to the wiring lines is embedded in an insulating layer being the lowermost layer. The electrode pad embedded in the insulating layer is used, for example, as a connection terminal when the circuit board is joined to another circuit board.

Incidentally, in the insulating layer in which the electrode pad is embedded, a thickness of a part formed by an insulating resin is not sufficiently secured in some cases. For example, when the insulating layer includes a reinforcing member for improving board strength, a thickness of an insulating resin adjacent to the layer including the reinforcing member is reduced. When the thickness of the insulating resin of the insulating layer is not sufficiently secured, a contact area between the insulating resin and the electrode pad is reduced, which causes a problem of decrease in fixing strength of the electrode pad with respect to the insulating layer. The decrease in fixing strength of the electrode pad causes the electrode pad to peel off from the insulating layer, which is not preferred.

SUMMARY

According to an aspect of an embodiment, a circuit board includes: an insulating layer having at least a part formed of an insulating resin; and an electrode pad embedded in the insulating layer and having a neck formed on an outer side surface, the neck being held in contact with the insulating resin of the insulating layer. The electrode pad includes: a first conductor layer having an end surface exposed from one surface of the insulating layer; and a second conductor layer formed on the first conductor layer and having a grain boundary density different from a grain boundary density of the first conductor layer. The neck is formed in a region of the outer side surface, the region corresponding to a boundary part between the first conductor layer and the second conductor layer.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENT

With reference to the drawings, a circuit board, a laminated circuit board, and a method of manufacturing a circuit board according to an embodiment disclosed in the present application are described below. Note that the embodiment is not intended to limit the disclosed technique.

Embodiment

Configuration of Circuit Board

Figure 1:
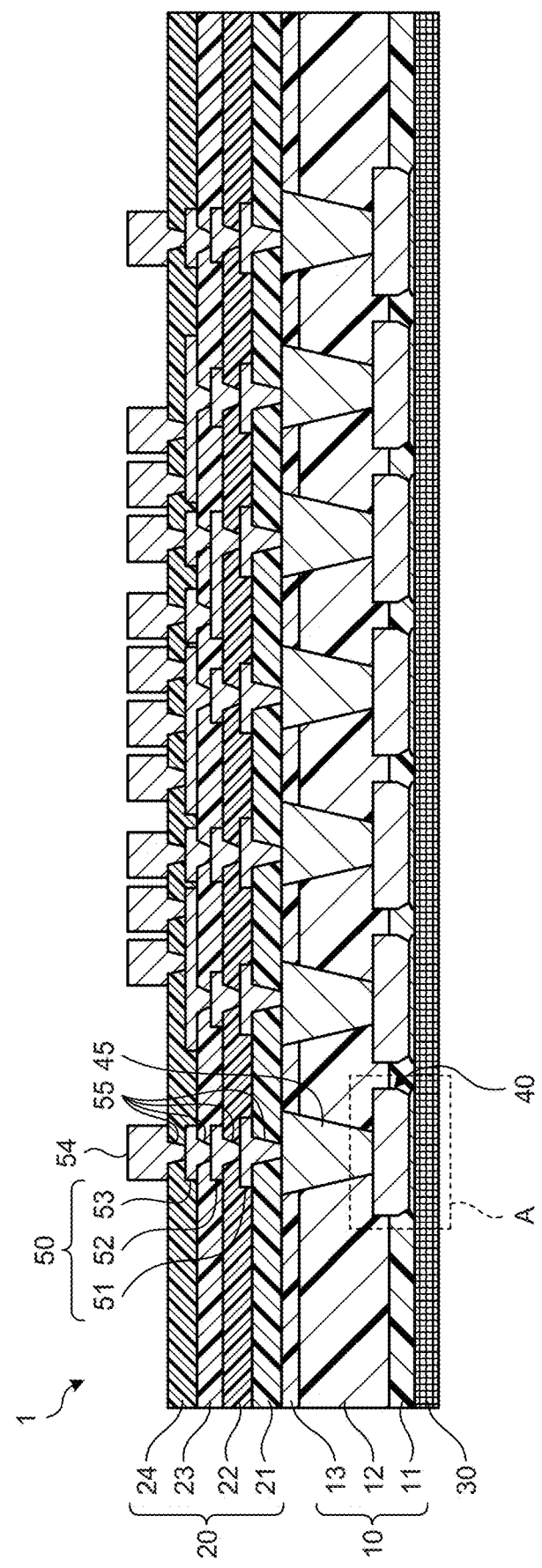
FIG. 1 is a view illustrating one example of a configuration of a circuit board according to an embodiment.

FIG. 1 is a view illustrating one example of a configuration of a circuit board 1 according to the embodiment. In FIG. 1, a cross section of the circuit board 1 is schematically illustrated.

The circuit board 1 has a lamination structure, and mainly includes a first wiring structure body 10, a second wiring structure body 20, and an adhesive layer 30. An electrode pad 40 is embedded in the first wiring structure body 10. Further, a via 45 that is connected to the electrode pad 40 is embedded in the first wiring structure body 10. The first wiring structure body 10 has a lamination structure having at least a part formed of an insulating resin, and is divided into a first insulating layer 11, a second insulating layer 12, and a third insulating layer 13. The first wiring structure body 10 is one example of an insulating layer. In the following, for convenience of description, a surface of the circuit board 1 on the second wiring structure body 20 side is referred to as an upper side, and a surface thereof on the adhesive layer 30 side is referred to as a lower surface. However, the circuit board 1 may be used in a vertical inversion manner, for example, and may be used in a freely selected posture.

The first insulating layer 11 is formed of an insulating resin. The insulating resin forming the first insulating layer 11 is cured in a thermosetting manner, for example.

The second insulating layer 12 is laminated on and adjacent to an upper part of the first insulating layer 11, and is formed by immersing a reinforcing member such as glass fibers in an insulating resin. The reinforcing member included in the second insulating layer 12 improves strength of the circuit board 1. The insulating resin in which the reinforcing member of the second insulating layer 12 is immersed is cured in a thermosetting manner, for example. In the first insulating layer 11 and the second insulating layer 12, the electrode pad 40 is embedded. The electrode pad 40 is formed of a conductor such as copper, and is used as a connection terminal when the circuit board 1 is joined to another circuit board. A specific configuration of the electrode pad 40 is described later.

The third insulating layer 13 is laminated on and adjacent to an upper part of the second insulating layer 12, and is formed of an insulating resin. The insulating resin forming the third insulating layer 13 is cured in a thermosetting manner, for example. In the second insulating layer 12 and the third insulating layer 13, the via 45 is embedded. The via 45 is formed at a position of a via hole that passes through the second insulating layer 12 and the third insulating layer 13 and exposes the electrode pad 40, and is connected to the electrode pad 40.

Note that, the first insulating layer 11 and the third insulating layer 13 formed of a thermosetting resin are insulating layers including no reinforcing member such as glass fibers. Here, "being formed of a thermosetting resin" indicates that a reinforcing member such as glass fibers is not included, and indicates that other elements such as a filler may be included in place of the thermosetting resin.

The second wiring structure body 20 is formed on the first wiring structure body 10, has a lamination structure formed of an insulating resin, and is divided into a fourth insulating layer 21, a fifth insulating layer 22, a sixth insulating layer 23, and a seventh insulating layer 24. The insulating resin forming the second wiring structure body 20 is a photosensitive resin. A wiring line 50 that connects adjacent layers to each other is embedded in the second wiring structure body 20. The wiring line 50 includes a first wiring line layer 51, a second wiring line layer 52, and a third wiring line layer 53. Further, on the second wiring structure body 20, a fourth wiring line layer 54 is formed.

The fourth insulating layer 21 is laminated on and adjacent to an upper part of the first wiring structure body 10. On the fourth insulating layer 21, the first wiring line layer 51 is formed. The first wiring line layer 51 is connected to the via 45 through a via 55 embedded in the fourth insulating layer 21.

The fifth insulating layer 22 is laminated on and adjacent to an upper part of the fourth insulating layer 21. On the fifth insulating layer 22, the second wiring line layer 52 is formed. The second wiring line layer 52 is connected to the first wiring line layer 51 through the via 55 embedded in the fifth insulating layer 22.

The sixth insulating layer 23 is laminated to be adjacent to an upper part of the fifth insulating layer 22. On the sixth insulating layer 23, the third wiring line layer 53 is formed. The third wiring line layer 53 is connected to the second wiring line layer 52 through the via 55 embedded in the sixth insulating layer 23.

The seventh insulating layer 24 is laminated on and adjacent to an upper part of the sixth insulating layer 23. On the seventh insulating layer 24, the fourth wiring line layer 54 is formed. The fourth wiring line layer 54 is connected to the third wiring line layer 53 through the via 55 embedded in the seventh insulating layer 24. The fourth wiring line layer 54 is used as a contact point with an external component such as a semiconductor chip.

The adhesive layer 30 is formed on a lower surface of the first wiring structure body 10 so as to cover and end surface of a first conductor layer 41 of the electrode pad 40 described later. The adhesive layer 30 is formed of an insulating resin such as a non-conductive film (NCF), and is layer for bonding the circuit board 1 to another circuit board. The insulating resin forming the adhesive layer 30 is cured in a thermosetting manner, for example.

Configuration of Electrode Pad

Figure 2:
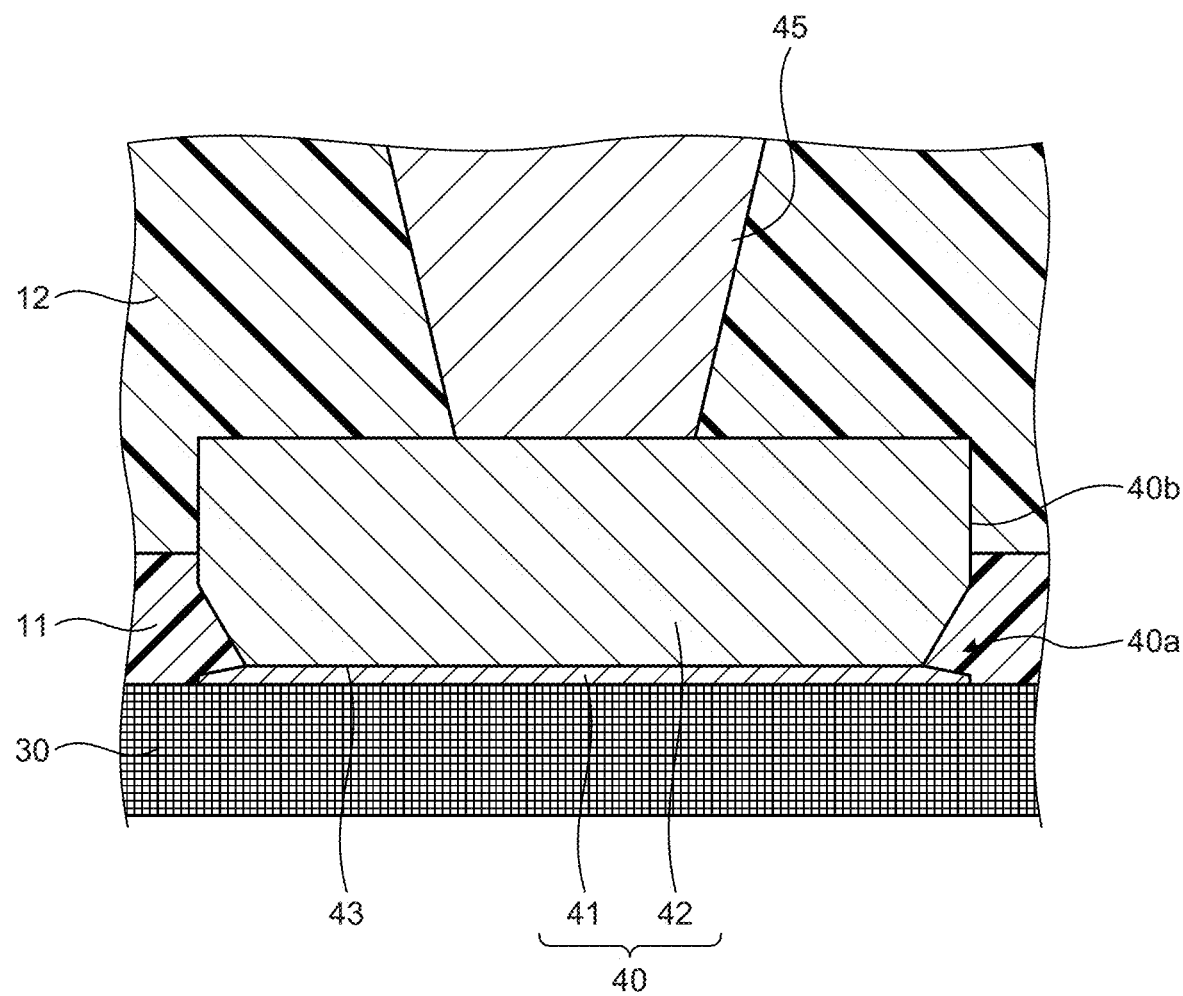
FIG. 2 is a view illustrating one example of a specific configuration of an electrode pad in the embodiment.

FIG. 2 is a view illustrating one example of a specific configuration of the electrode pad 40 in the embodiment. In FIG. 2, a part A in FIG. 1 is illustrated in an enlarged manner. As described above, the electrode pad 40 is embedded in the first insulating layer 11 and the second insulating layer 12 of the first wiring structure body 10. A neck 40a held in contact with the insulating resin of the first wiring structure body 10 is formed on an outer side surface 40b of the electrode pad 40. Specifically, the electrode pad 40 includes the first conductor layer 41 having an end surface exposed from the lower surface of the first wiring structure body 10 (the first insulating layer 11) and a second conductor layer 42 that is formed on the first conductor layer 41 and has a grain boundary density different from that of the first conductor layer 41. A thickness of the first conductor layer 41 can be set to, for example, from 100 nm to 300 nm, and a thickness of the second conductor layer 42 can be set to, for example, from 10 μm to 20 μm. Further, the neck 40a is formed on a region of the outer side surface 40b of the electrode pad 40, which corresponds to a boundary part 43 between the first conductor layer 41 and the second conductor layer 42. In the present embodiment, the boundary part 43 between the first conductor layer 41 and the second conductor layer 42 is positioned inside the first insulating layer 11 of the first wiring structure body 10, and hence the neck 40a is held in contact with the insulating resin of the first insulating layer 11 inside the first insulating layer 11 of the first wiring structure body 10.

The neck 40a held in contact with the insulating resin of the first wiring structure body 10 is formed on the outer side surface 40b of the electrode pad 40. With this, even when the thickness of the insulating resin of the first wiring structure body 10 is not secured sufficiently, the outer side surface 40b of the electrode pad 40 is firmly held in close contact with the insulating resin. For example, even when, in the first wiring structure body 10 including the second insulating layer 12 that includes a reinforcing member, the thickness of the insulating resin (that is, the first insulating layer 11) adjacent to the second insulating layer 12 is not secured sufficiently, the insulating resin fills the neck 40a, and close contact with the outer side surface 40b of the electrode pad 40 is secured. As a result, fixing strength of the electrode pad 40 with respect to the first wiring structure body 10 can be improved.

Method of Manufacturing Circuit Board

Figure 3:
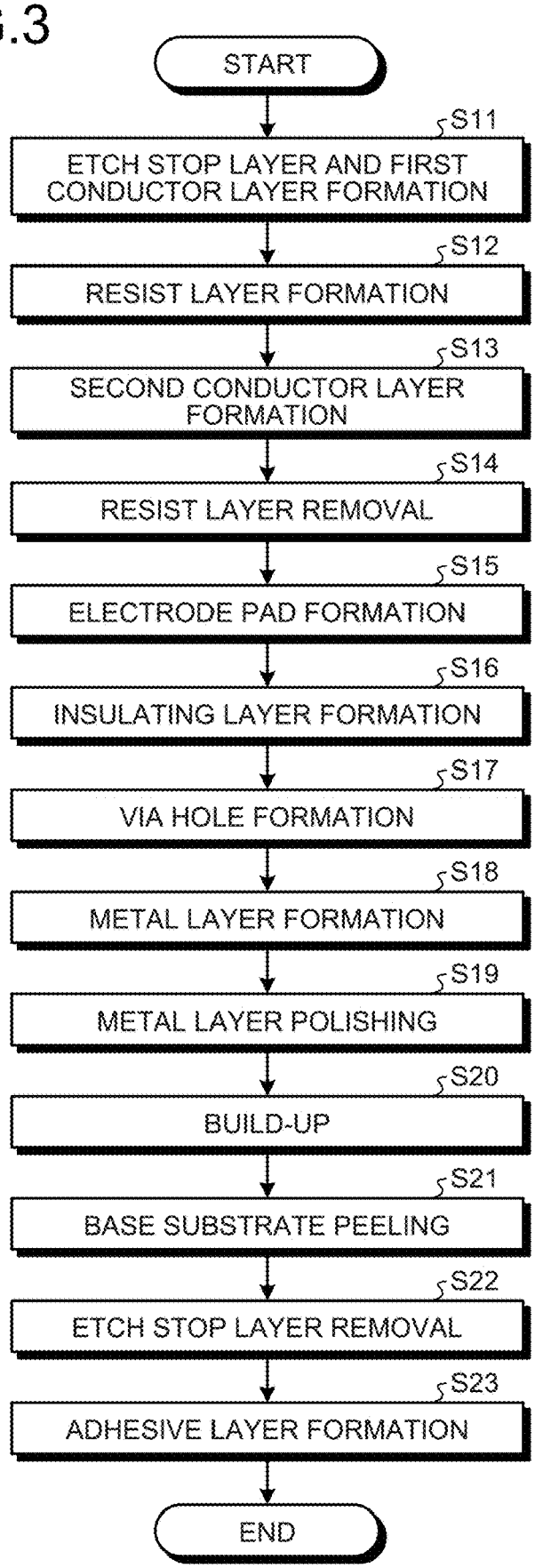
FIG. 3 is a flowchart illustrating one example of a method of manufacturing a circuit board according to an embodiment.

Next, with reference to a flowchart in FIG. 3, a method of manufacturing the circuit board 1 configured as described above is described while giving a specific example. FIG. 3 is a flowchart illustrating one example of the method of manufacturing the circuit board 1 according to the embodiment.

Figure 4:
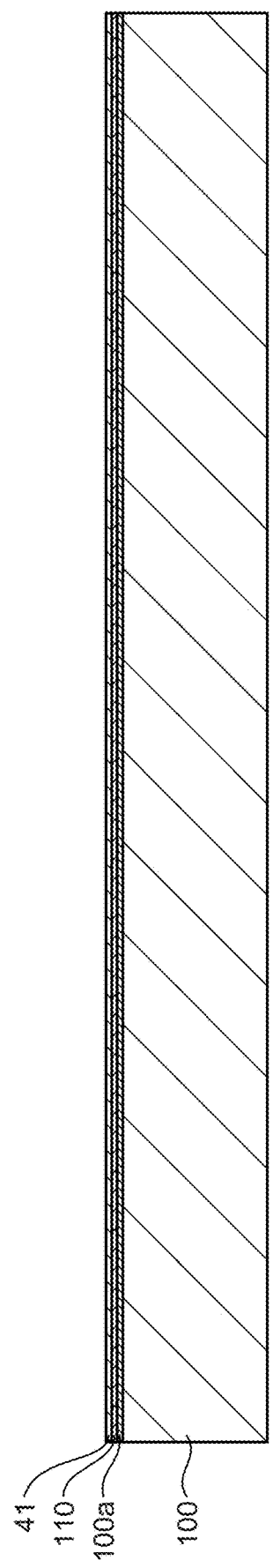
FIG. 4 is a view illustrating a specific example of an etch stop layer formation process and a first conductor layer formation process.

First, an etch stop layer and the first conductor layer 41 are formed on a base substrate (Step S11). Specifically, as illustrated in FIG. 4, for example, a base substrate 100 including a peeling layer 100a formed on an upper surface thereof is prepared, an etch stop layer 110 and the first conductor layer 41 are sequentially formed on the base substrate 100. FIG. 4 is a view illustrating a specific example of an etch stop layer formation process and a first conductor layer formation process. The base substrate 100 is a substrate having a flat upper surface, and is, for example, a glass substrate. An etch stop layer 110 is a layer having etching durability with respect to an etchant used for etching of the first conductor layer 41. The etch stop layer 110 is metal such as titanium, and the first conductor layer 41 is metal such as copper. The etch stop layer 110 and the first conductor layer 41 are each formed by sputtering, for example.

Figure 5:
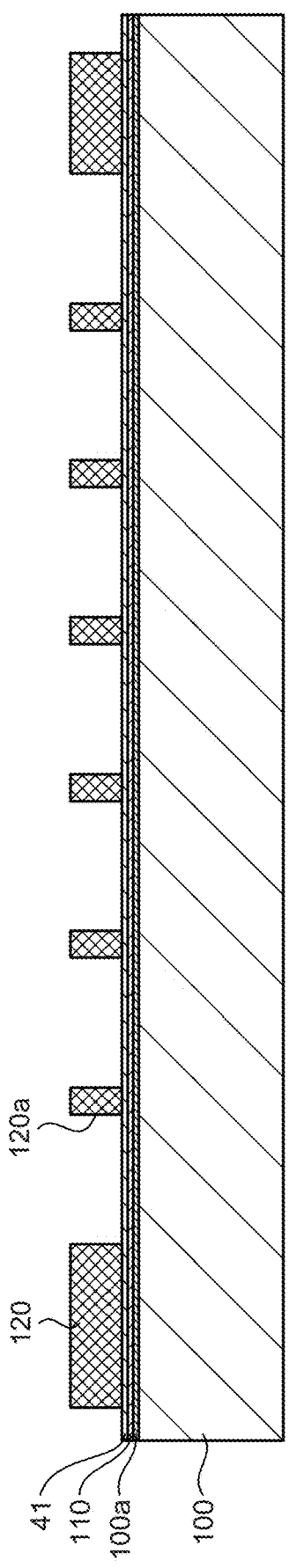
FIG. 5 is a view illustrating a specific example of a resist layer formation process.

Subsequently, a resist layer having a plurality of openings is formed on the first conductor layer 41 (Step S12). Specifically, as illustrated in FIG. 5, a resist layer 120 having a plurality of openings 120a is formed on the first conductor layer 41. FIG. 5 is a view illustrating a specific example of a resist layer formation process. The resist layer 120 is a dry film resist, for example. The plurality of openings 120a are formed by a photolithographic method in a region in which the second conductor layer 42 is designed to be formed, for example. From the openings 120a of the resist layer 120, the first conductor layer 41 is exposed.

Figure 6:
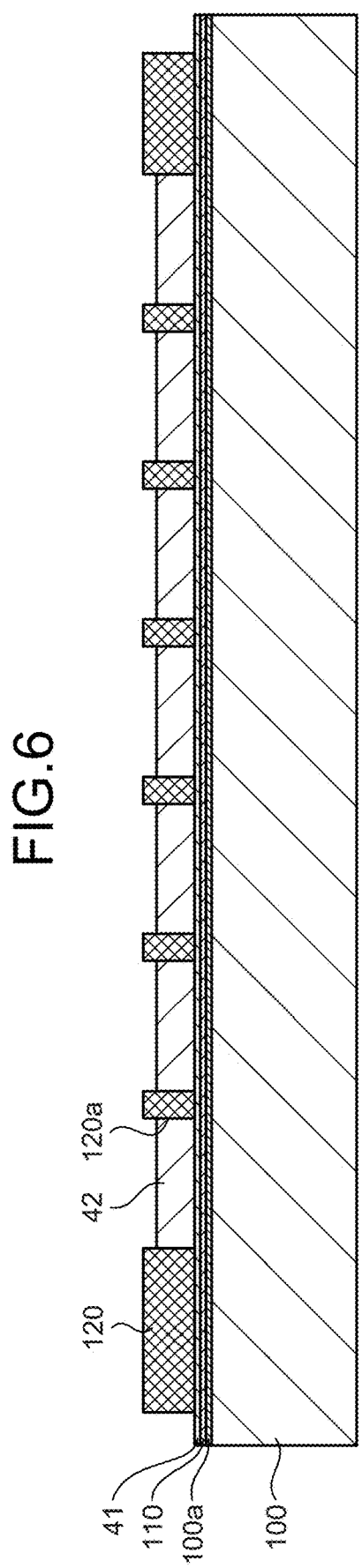
FIG. 6 is a view illustrating a specific example of a second conductor layer formation process.

The second conductor layer 42 is formed on the first conductor layer 41 exposed from the openings 120a of the resist layer 120 (Step S13). Specifically, as illustrated in FIG. 6, for example, by electroplating with the first conductor layer 41 as an electrode, the second conductor layer 42 is formed on the first conductor layer 41 exposed from the openings 120a of the resist layer 120. FIG. 6 is a view illustrating a specific example of a second conductor layer formation process. The second conductor layer 42 formed by electroplating has a grain boundary density smaller than that of the first conductor layer 41 formed by sputtering. The first conductor layer 41 and the second conductor layer 42 have different grain boundary densities, and hence etching durability of the boundary part between the first conductor layer 41 and the second conductor layer 42 is smaller than that of other parts.

Figure 7:
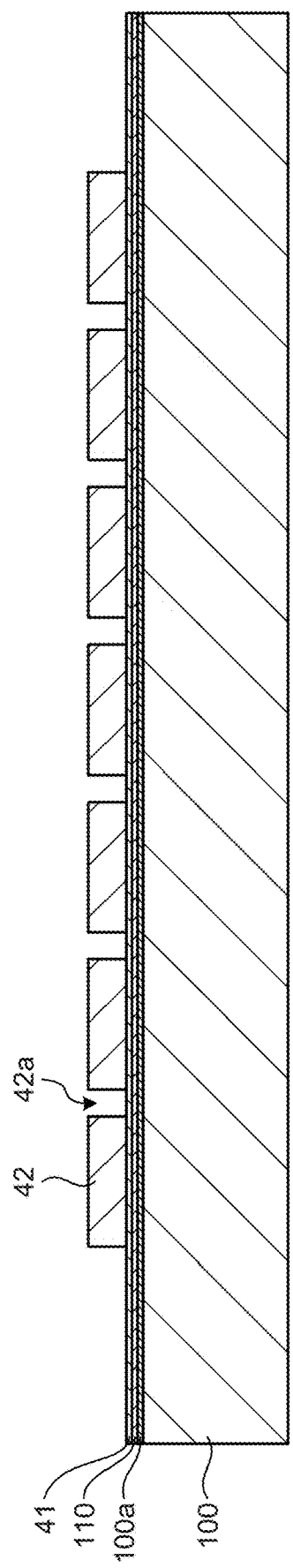
FIG. 7 is a view illustrating a specific example of a resist layer removal process.

The resist layer 120 is removed, and a gap is formed between the second conductor layers 42 adjacent to each other (Step S14). Specifically, as illustrated in FIG. 7, for example, a gap 42a is formed the adjacent second conductor layers 42. The first conductor layer 41 is exposed from the gap 42a. FIG. 7 is a view illustrating a specific example of a resist layer removal process.

Figure 8:
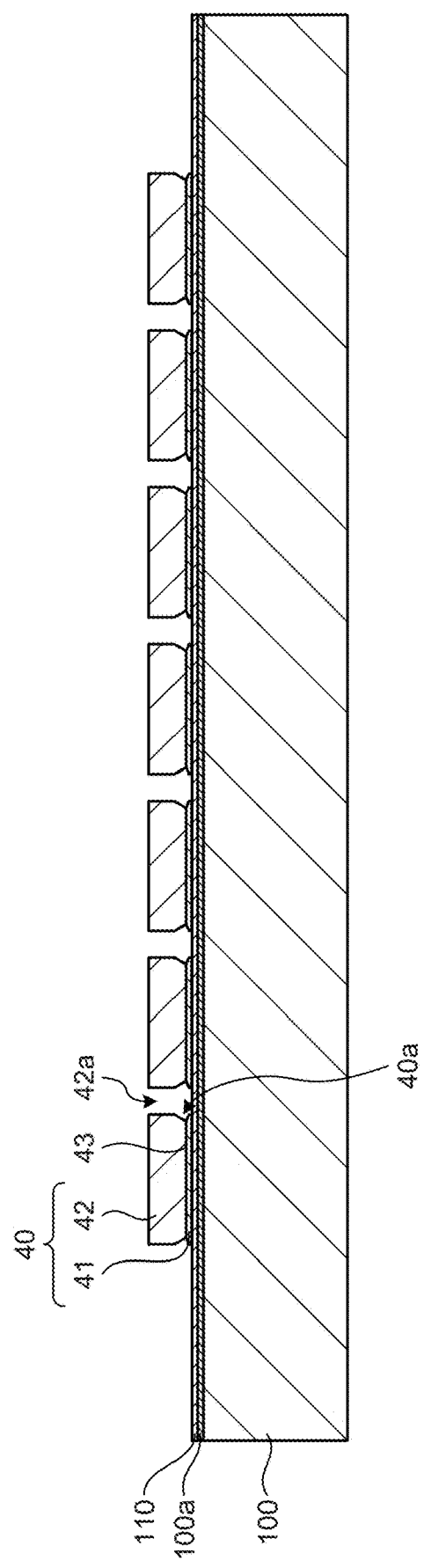
FIG. 8 is a view illustrating a specific example of an electrode pad formation process.

The first conductor layer 41 is subjected to etching until the etch stop layer 110 is exposed from the gap 42a, and the electrode pad 40 including the first conductor layer 41 and the second conductor layer 42 is formed (Step S15). Specifically, as illustrated in FIG. 8, for example, the first conductor layer 41 exposed from the gap 42a is subjected to etching, and the electrode pad 40 is formed. FIG. 8 is a view illustrating a specific example of an electrode pad formation process. The first conductor layer 41 is selectively subjected to etching through use of an etchant different from the etchant used for removal of the etch stop layer 110.

Figure 9:
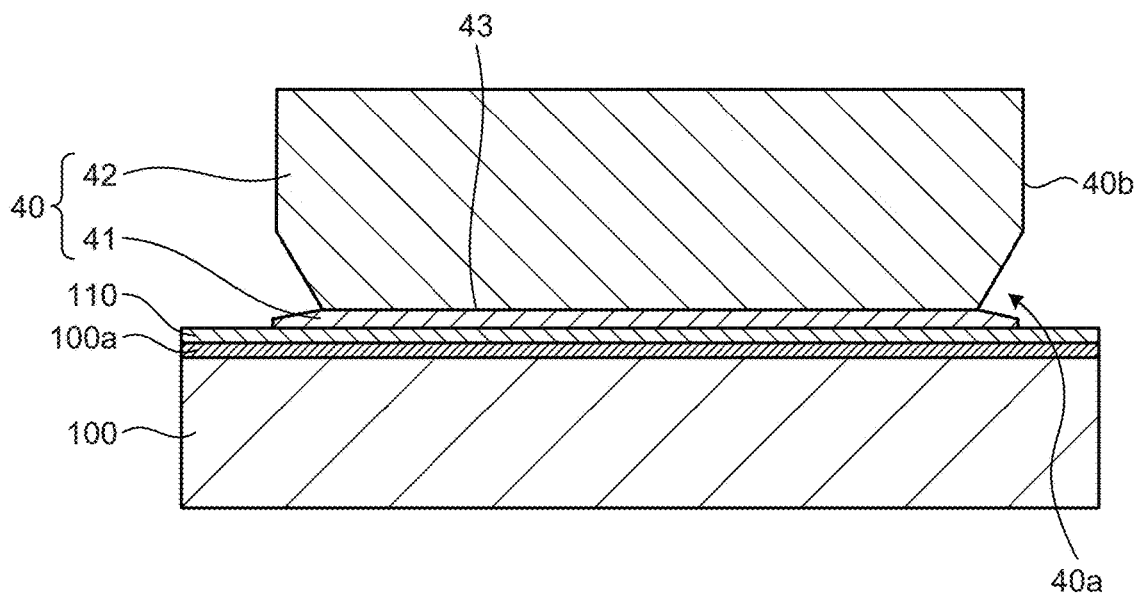
FIG. 9 is a view schematically illustrating one example of a neck shape.
Figure 10:
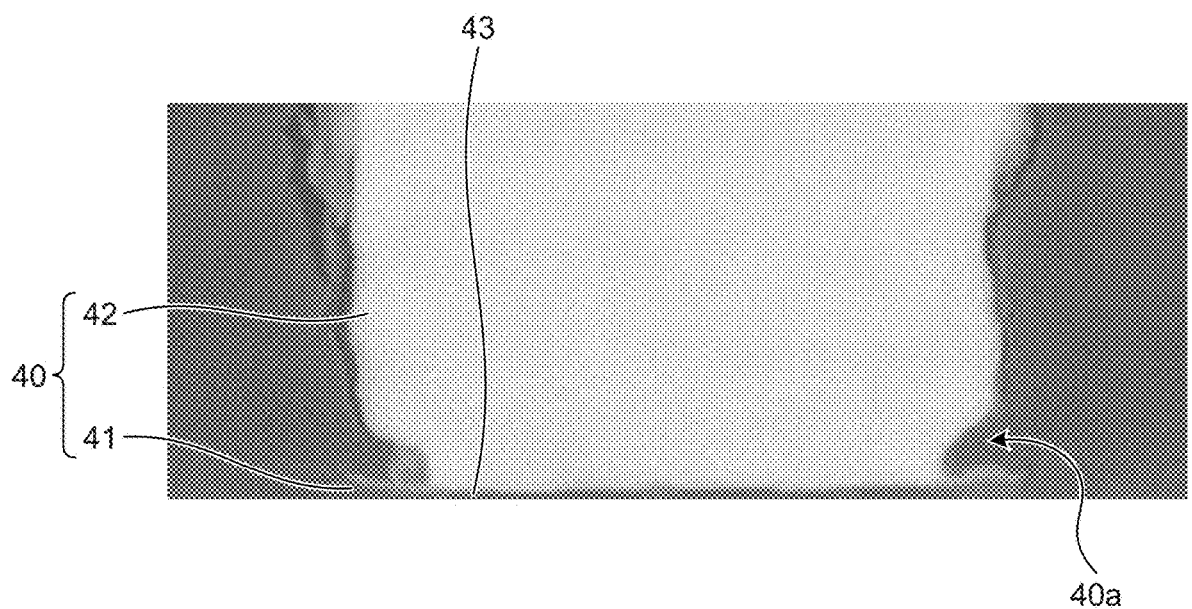
FIG. 10 is a photograph taken by enlarging a cross section of an electrode pad.

Further, while the first conductor layer 41 is being subjected to etching, the boundary part 43 between the first conductor layer 41 and the second conductor layer 42 is subjected to etching in a width direction of the gap 42a. Thus, the neck 40a is formed in the region of the outer side surface 40b of the electrode pad 40, which corresponds to the boundary part 43. In this case, the grain boundary density of the second conductor layer 42 is smaller than the grain boundary density of the first conductor layer 41, and hence the neck 40a is formed to have an asymmetric shape with respect to the boundary part 43 between the first conductor layer 41 and the second conductor layer 42. Specifically, as illustrated in FIG. 9 and FIG. 10, for example, the neck 40a is formed to have a shape in which inclination of a surface on an upper side of the boundary part 43 is larger than inclination of a surface on a lower side of the boundary part 43. FIG. 9 is a view schematically illustrating one example of the shape of the neck 40a. FIG. 10 is a view illustrating a photograph obtained by enlarging the cross section of the electrode pad 40.

Figure 11:
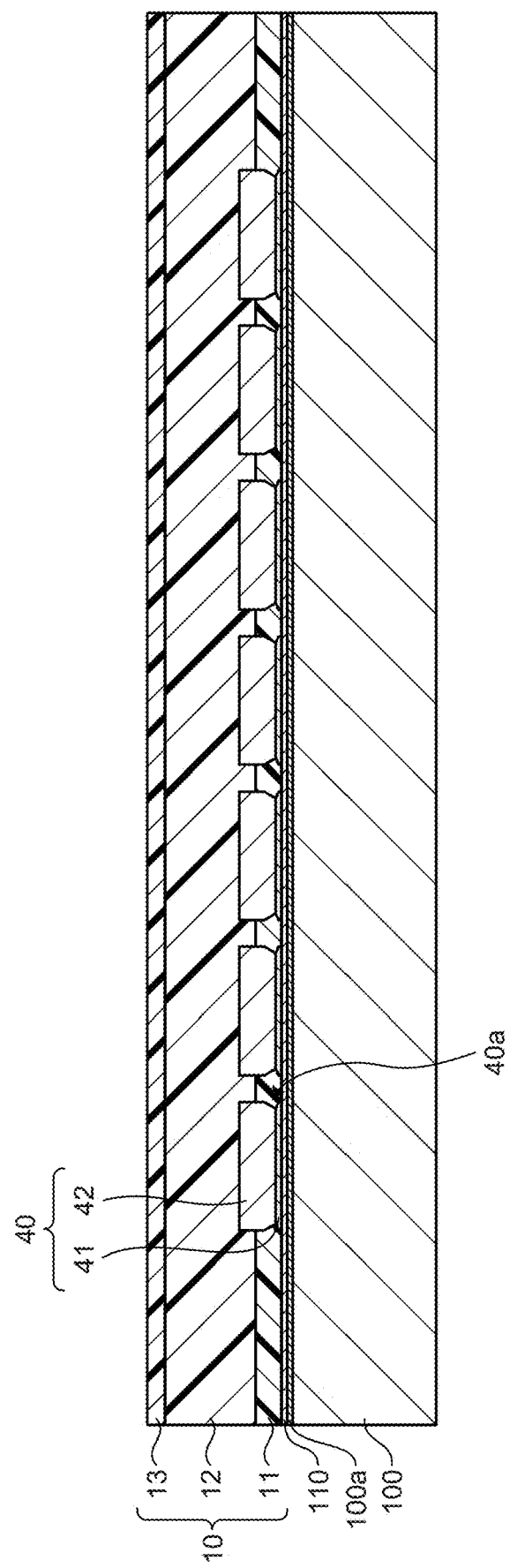
FIG. 11 is a view illustrating a specific example of an insulating layer formation process.

When the electrode pad 40 is formed, and the neck 40a is formed on the outer side surface 40b of the electrode pad 40, the first wiring structure body 10 covering the electrode pad 40 is formed on the etch stop layer 110, and the electrode pad 40 is embedded (Step S16). That is, as illustrated in FIG. 11, for example, the first insulating layer 11, the second insulating layer 12, and the third insulating layer 13 that are in a semi-cured state are subsequently laminated on the etch stop layer 110, and the first insulating layer 11 and the second insulating layer 12 cover the electrode pad 40. With this, under a state in which the neck 40a is held in contact with the insulating resin of the first insulating layer 11 inside the first insulating layer 11, the electrode pad 40 is embedded in the first wiring structure body 10. FIG. 11 is a view illustrating a specific example of an insulating layer formation process.

When the electrode pad 40 is embedded in the first wiring structure body 10, the first insulating layer 11, the second insulating layer 12, and the third insulating layer 13 of the first wiring structure body 10 are subjected to thermosetting. In this case, the neck 40a is held in contact with the insulating resin of the first insulating layer 11 inside the first insulating layer 11, and hence the insulating resin of the first insulating layer 11 fills the neck 40a. Thus, close contact between the electrode pad 40 and the insulating resin of the first insulating layer 11 is secured. With this, fixing strength of the electrode pad 40 with respect to the first wiring structure body 10 can be improved.

Figure 12:
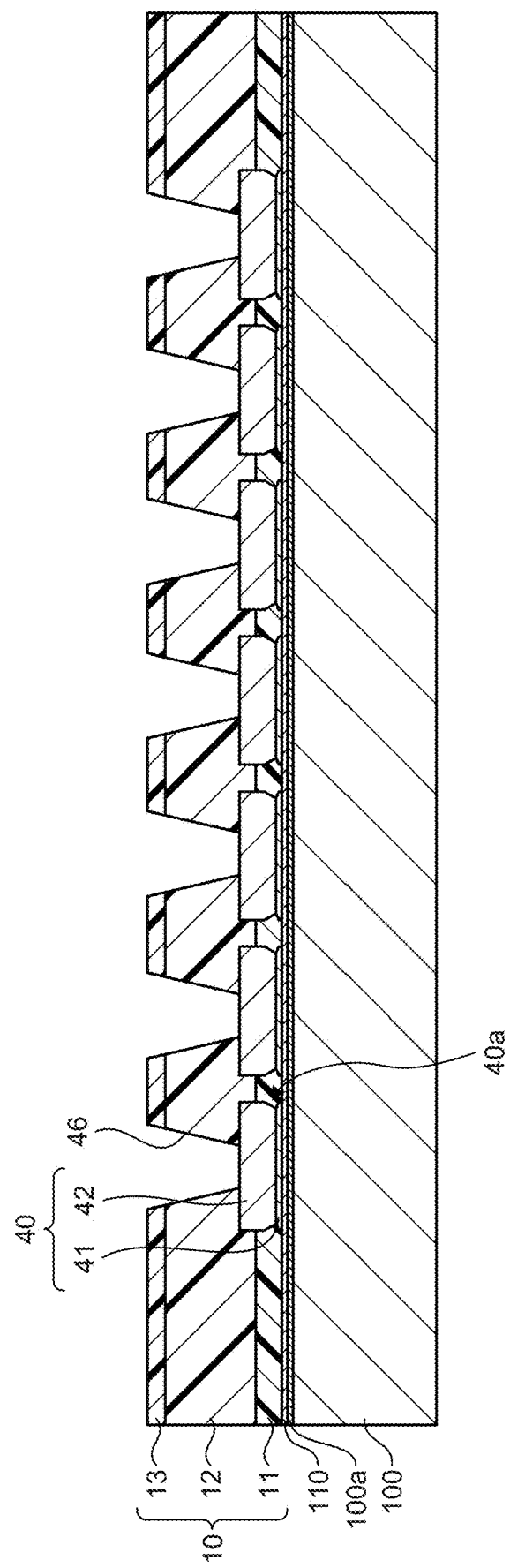
FIG. 12 is a view illustrating a specific example of a via hole formation process.

Further, a via hole that passes through the first wiring structure body 10 and exposes the second conductor layer 42 of the electrode pad 40 is formed (Step S17). That is, as illustrated in FIG. 12, for example, a via hole 46 that passes through the second insulating layer 12 and the third insulating layer 13 of the first wiring structure body 10 and exposes the second conductor layer 42 of the electrode pad 40 is formed by, for example, laser machining. FIG. 12 is a view illustrating a specific example of a via hole formation process.

Figure 13:
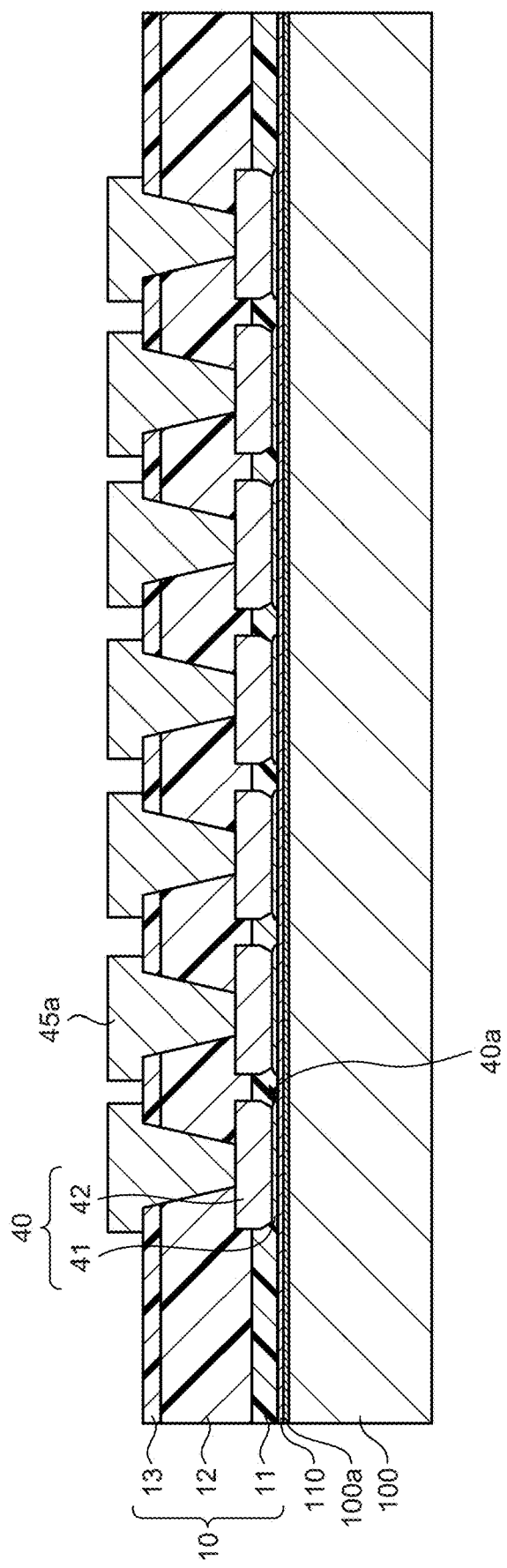
FIG. 13 is a view illustrating a specific example of a metal layer formation process.

The via 45 is formed in the via hole 46. For example, as illustrated in FIG. 13, the via 45 is formed in the following manner. Specifically, at the position of the via hole 46, a metal layer 45a is formed to have a part thereof exposed from an upper surface of the first wiring structure body 10 and the rest is embedded in the first wiring structure body 10 (Step S18). Then, the part of the metal layer 45*a*, which is exposed from the upper surface of the first wiring structure body 10, is removed (Step S19). FIG. 13 is a view illustrating a specific example of a metal layer formation process. Formation of the metal layer 45*a* is performed by, for example, a semi additive process (SAP). The metal layer 45*a* is connected to the second conductor layer 42 of the electrode pad 40, which is exposed from a bottom of the via hole 46. In the present embodiment, the neck 40*a* of the electrode pad 40 secures close contact between the electrode pad 40 and the insulating resin of the first insulating layer 11, and hence the electrode pad 40 can be prevented from peeling off from the first wiring structure body 10. As a result, the second conductor layer 42 of the electrode pad 40 can be prevented from peeling off from the via 45, and connection reliability between the electrode pad 40 and the via 45 can be improved.

Figure 14:
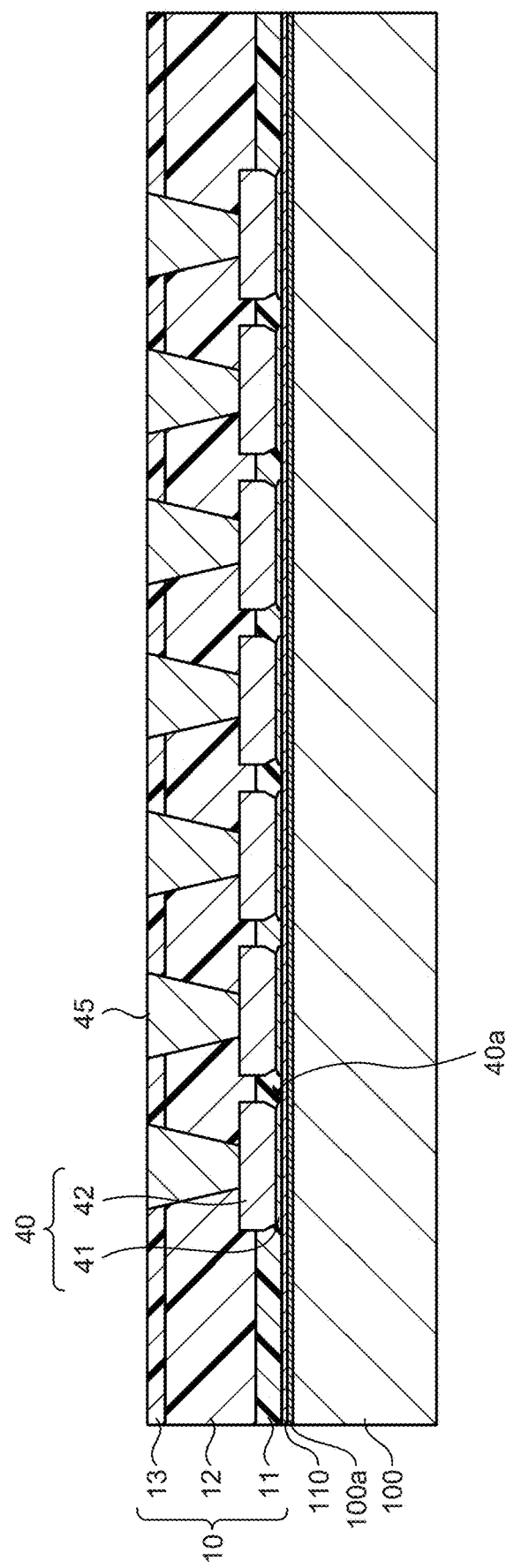
FIG. 14 is a view illustrating a specific example after a metal layer polishing process.

When the metal layer 45*a* is formed, on the upper surface of the first wiring structure body 10, the part of the metal layer 45*a*, which is exposed from the upper surface of the first wiring structure body 10, is polished, and the via 45 is obtained (Step S19). FIG. 14 is a view illustrating a specific example after a metal layer polishing process. Polishing of the metal layer 45*a* is performed by chemical mechanical polishing (CMP).

While polishing the metal layer 45*a*, an upper surface of the third insulating layer 13 may be polished. In this case, unevenness of the upper surface of the third insulating layer 13, which is caused at the time of lamination, is removed by polishing, and a flatter surface is obtained. With high flatness of the upper surface of the third insulating layer 13, a wiring line of the second wiring structure body 20 formed on the upper surface of the third insulating layer 13 can be formed more finely.

Figure 15:
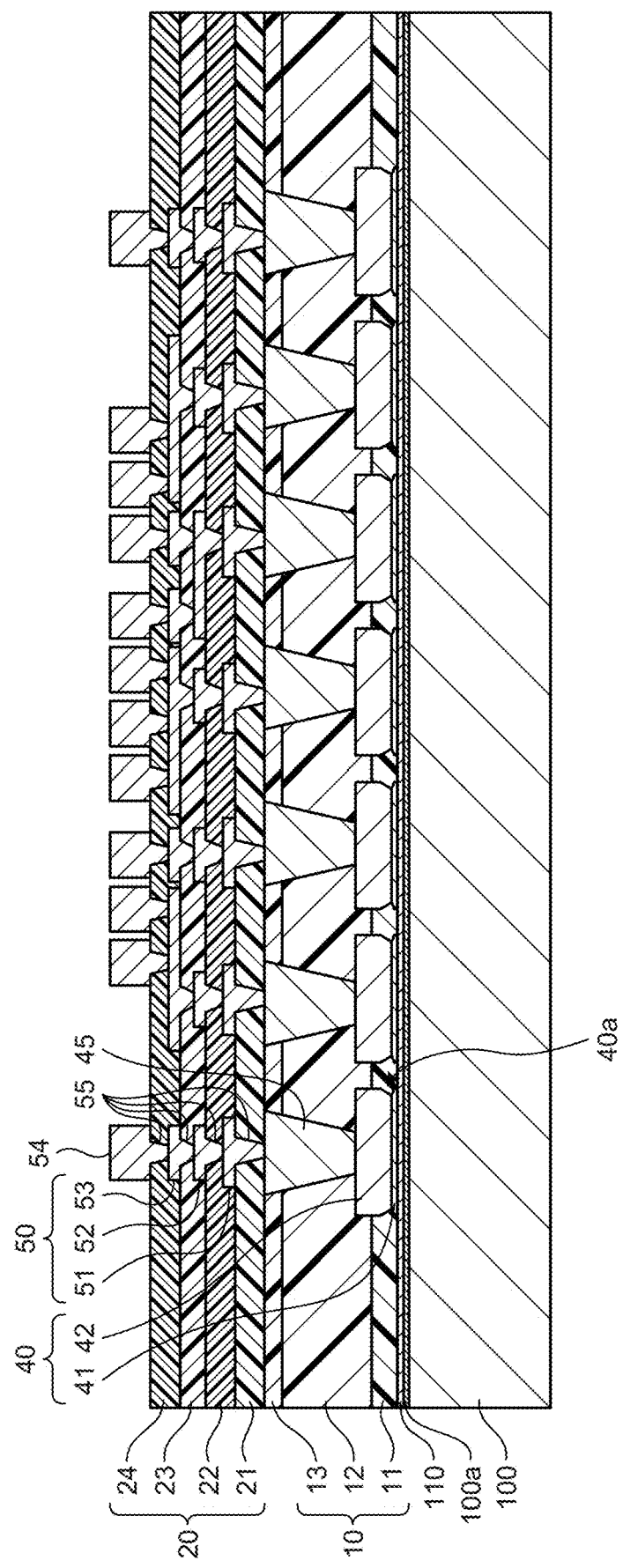
FIG. 15 is a view illustrating a specific example of a build-up process.

Further, at a build-up process, the fourth insulating layer 21 to the seventh insulating layer 24 of the second wiring structure body 20 are laminated (Step S20). That is, as illustrated in FIG. 15, for example, the fourth insulating layer 21 to the seventh insulating layer 24 are laminated, and inter layers therebetween are connected by the wiring line 50, and the first wiring line layer 51 on the fourth insulating layer 21 is connected to the via 45 through the via 55 inside the fourth insulating layer 21. FIG. 15 is a view illustrating a specific example of an build-up process.

Figure 16:
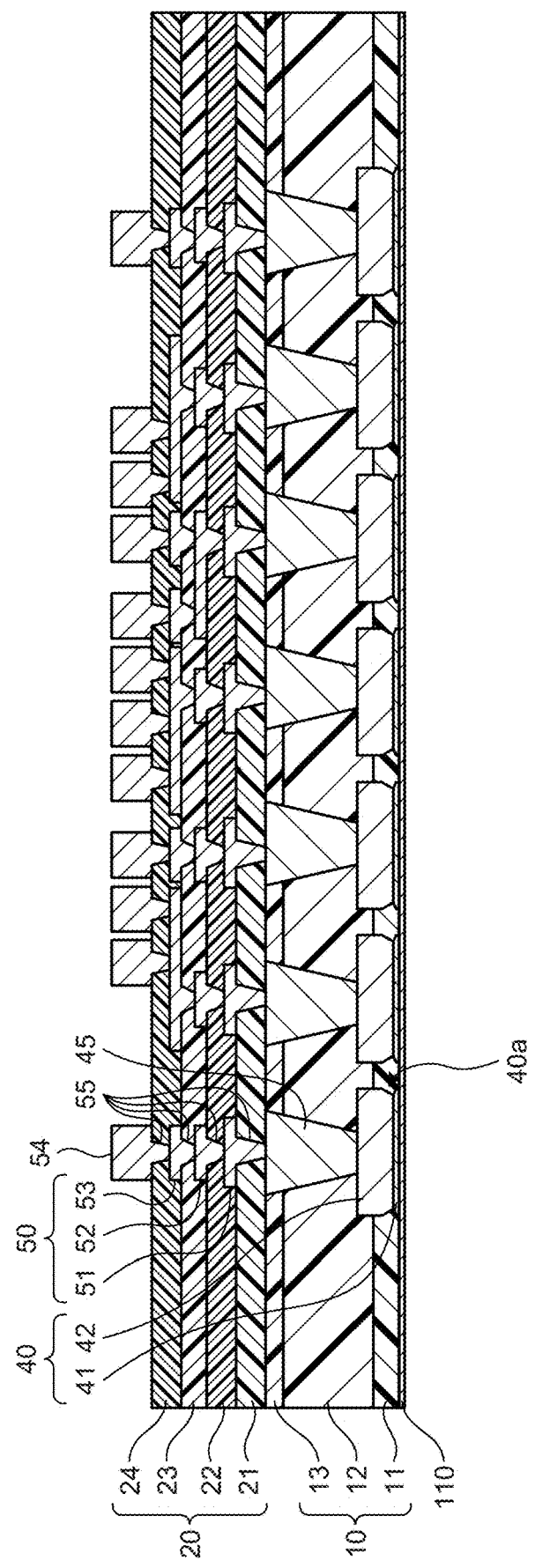
FIG. 16 is a view illustrating a specific example of a peeling process.

Further, the base substrate 100 is peeled off from the etch stop layer 110 (Step S21). That is, as illustrated in FIG. 16, for example, the base substrate 100 is peeled off from the etch stop layer 110 together with the peeling layer 100*a*, and the etch stop layer 110 is exposed. FIG. 16 is a view illustrating a specific example of a peeling process.

Figure 17:
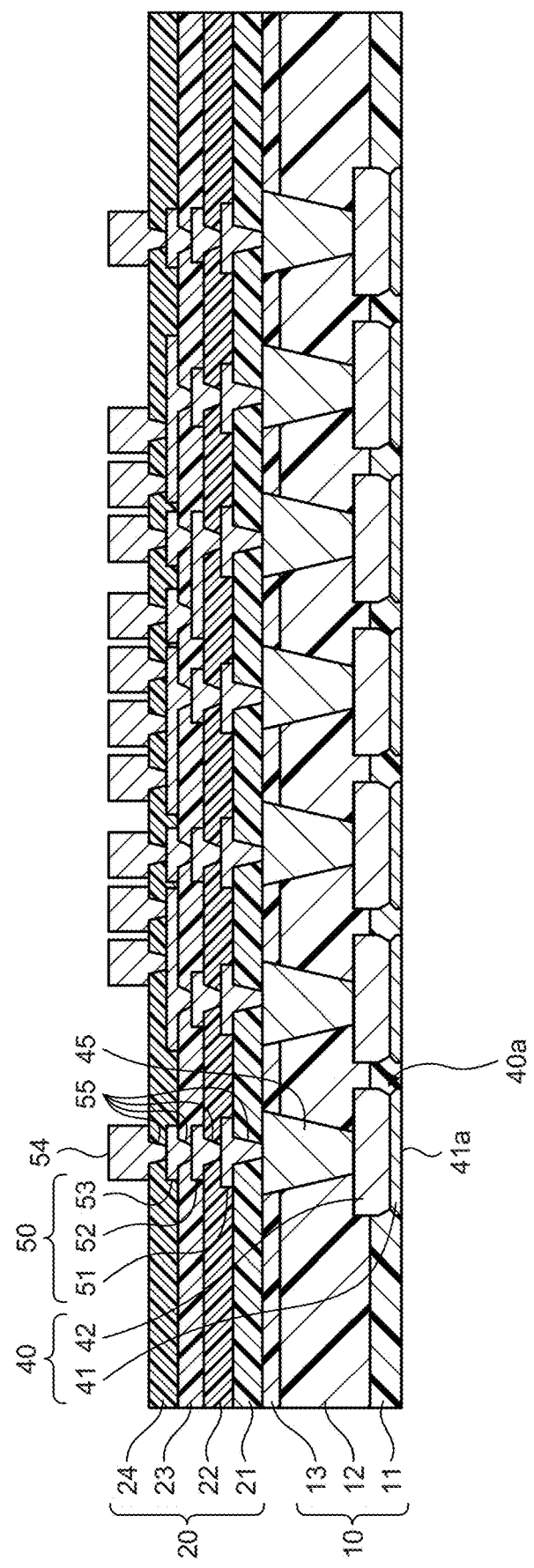
FIG. 17 is a view illustrating a specific example of an etch stop layer removal process.

When the base substrate 100 is peeled off, the etch stop layer 110 is removed, and an end surface of the first conductor layer 41 of the electrode pad 40 is exposed from the lower surface of the first wiring structure body 10 (Step S22). That is, as illustrated in FIG. 17, for example, the etch stop layer 110 is removed by, for example, etching, and an end surface 41*a* of the first conductor layer 41 of the electrode pad 40 is exposed from the lower surface of the first wiring structure body 10. FIG. 17 is a view illustrating a specific example of an etch stop layer removal process.

The etch stop layer 110 is subjected to etching through use of an etchant different from the etchant used for etching of the first conductor layer 41. With this, on the lower surface of the first wiring structure body 10, the end surface 41*a* of the first conductor layer 41 is not subjected to etching, and a smooth flat surface with less roughness is maintained. Further, in the present embodiment, similarly to an upper surface of the base substrate 100, an upper surface of the etch stop layer 110 is flat, and hence the end surface 41*a*, which is obtained by removing the etch stop layer 110 and is exposed from the lower surface of the first wiring structure body 10, and the lower surface of the first wiring structure body 10 are positioned on the same plane. With this, the first conductor layer 41 is formed so that the end surface 41*a* exposed from the lower surface of the first wiring structure body 10 is flush with the lower surface of the first wiring structure body 10.

Figure 18:
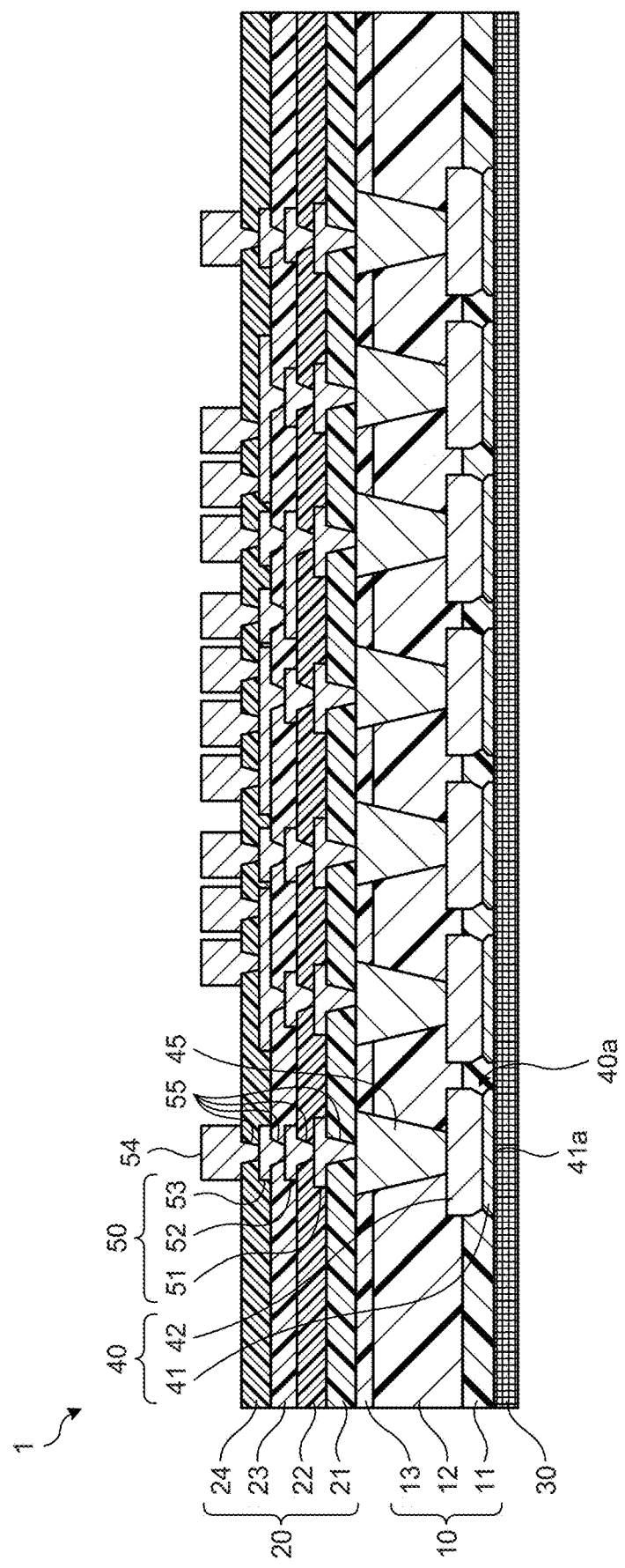
FIG. 18 is a view illustrating a specific example of an adhesive layer formation process.

Further, the adhesive layer 30 that covers the end surface 41*a* of the first conductor layer 41 is formed on the lower surface of the first wiring structure body 10 (Step S23). That is, as illustrated in FIG. 18, for example, the adhesive layer 30 in a semi-cured state is laminated on the lower surface of the first wiring structure body 10 so as to cover the end surface 41*a* of the first conductor layer 41, and the adhesive layer 30 is subjected to thermosetting. In this case, the end surface 41*a* of the first conductor layer 41 and the lower surface of the first wiring structure body 10 are positioned on the same plane, and hence a thickness of the adhesive layer 30 formed on the lower surface of the first wiring structure body 10 can be formed evenly. FIG. 18 is a view illustrating a specific example of an adhesive layer formation process. The adhesive layer 30 is used to bond the circuit board 1 to another circuit board.

As described above, the circuit board 1 according to the embodiment includes the first wiring structure body 10 and the electrode pad 40. The first wiring structure body 10 has at least a part formed of an insulating resin. The electrode pad 40 is embedded in the first wiring structure body 10. Further, the neck 40*a* held in contact with the insulating resin of the first wiring structure body 10 is formed on the outer side surface 40*b* of the electrode pad 40. With this, the insulating resin of the first wiring structure body 10 fills the neck 40*a* of the electrode pad 40, and close contact between the electrode pad 40 and the insulating resin is secured. As a result, fixing strength of the electrode pad 40 with respect to the first wiring structure body 10 can be improved.

Further, in the circuit board 1 according to the embodiment, the electrode pad 40 includes the first conductor layer 41, which has the end surface 41*a* exposed from the lower surface of the first wiring structure body 10, and the second conductor layer 42, which is formed on the first conductor layer 41 and has a grain boundary density different from that of the first conductor layer 41. Further, the neck 40*a* is formed in the region of the outer side surface 40*b*, which corresponds to the boundary part 43 between the first conductor layer 41 and the second conductor layer 42. With this, at the boundary part of the two conductor layers having different grain boundary densities, the neck 40*a* held in contact with the insulating resin of the first wiring structure body 10 can be formed efficiently.

Further, in the circuit board 1 according to the embodiment, the first wiring structure body 10 includes the first insulating layer 11, which is formed of an insulating resin, and the second insulating layer 12, which is laminated on the first insulating layer 11 and is formed of an insulating resin and a reinforcing member. Further, the electrode pad 40 is embedded in the first insulating layer 11 and the second insulating layer 12. The neck 40*a* is held in contact with the insulating resin of the first insulating layer 11. With this, even when, in the first wiring structure body 10, the thickness of the first insulating layer 11 adjacent to the second insulating layer 12 is not sufficiently secured, close contact between the electrode pad 40 and the insulating resin of the first insulating layer 11 is secured. Thus, fixing strength of the electrode pad 40 with respect to the first wiring structure body 10 can be improved.

Further, in the circuit board 1 according to the embodiment, the first conductor layer 41 is formed so that the end surface 41a, which is exposed from the lower surface of the first wiring structure body 10, and the lower surface of the first wiring structure body 10 are positioned on the same plane. Further, on the lower surface of the first wiring structure body 10, the adhesive layer 30 for bonding the circuit board 1 to another circuit board is formed. With this, the thickness of the adhesive layer 30 formed on the lower surface of the first wiring structure body 10 can be formed evenly. Thus, when the circuit board 1 is bonded to another circuit board, the adhesive layer 30 is evenly pushed outward from the lower surface of the first wiring structure body 10, and is prevented from remaining on the end surface 41a of the electrode pad 40. As a result, even when the electrode pad 40 is used as a connection terminal with respect to another circuit board, biting of the adhesive layer 30 between the electrode pad 40 and an electrode pad of another circuit board is prevented, and hence connection reliability of the electrode pad 40 can be improved.

Further, the circuit board 1 according to the embodiment further includes the via 45 that is embedded in the first wiring structure body 10 and is connected to the electrode pad 40. With this, the via 45 is connected to the electrode pad 40 having high close contact with the insulating resin. Thus, peeling between the via 45 and the electrode pad 40 can be prevented, and connection reliability between the electrode pad 40 and the via 45 can be improved.

Application Example of Circuit Board

Figure 19:
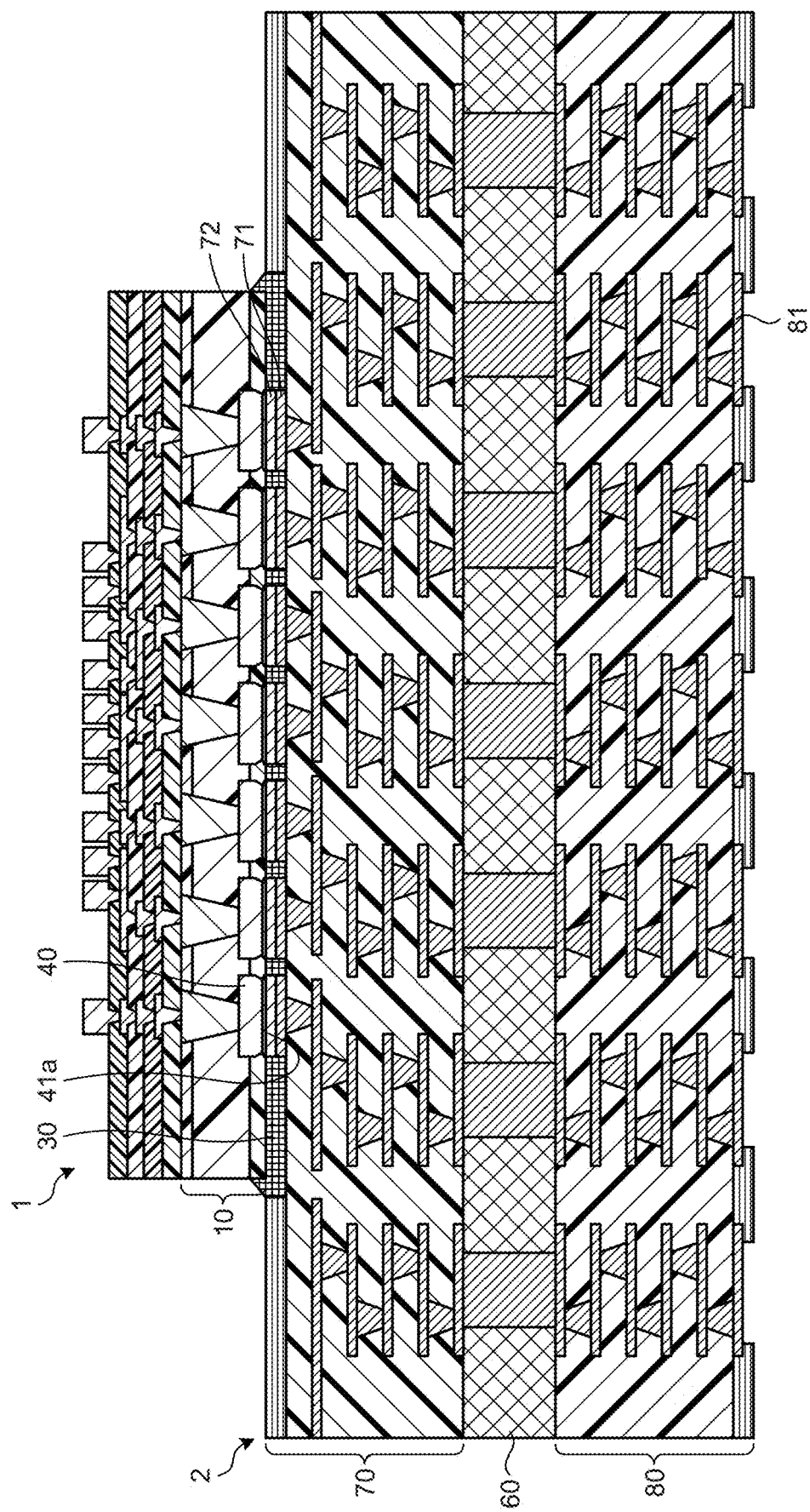
FIG. 19 is a view illustrating one example of a configuration of a laminated circuit board according to an embodiment.

The circuit board 1 configured as described above is applicable to a laminated circuit board formed by, for example, laminating two circuit boards. FIG. 19 is a view illustrating one example of a configuration of a laminated circuit board according to the embodiment.

The laminated circuit board illustrated in FIG. 19 includes a circuit board 2 and the circuit board 1. The circuit board 2 includes a core layer 60, a build-up layer 70 laminated on an upper surface of the core layer 60, and a build-up layer 80 laminated on a lower surface of the core layer 60. An electrode pad 71 is formed on an upper surface of the build-up layer 70, and an electrode pad 81 is formed on a lower surface of the build-up layer 80. The electrode pad 71 is formed of a conductor such as copper, and is used as a connection terminal when the circuit board 2 is joined to the circuit board 1. The electrode pad 81 is formed of a conductor such as copper, and is used as a connection terminal when the circuit board 2 is joined to an external component such as a mother board. Further, wiring lines that are electrically connect the electrode pad 71 and the electrode pad 81 are formed inside the core layer 60, inside the build-up layer 70, and inside the build-up layer 80.

The circuit board 1 is mounted on the circuit board 2. That is, the electrode pad 40 being a connection terminal of the circuit board 1 and the electrode pad 71 being a connection terminal of the circuit board 2 are joined by solder 72. Further, the adhesive layer 30 of the circuit board 1 is arranged between a lower surface of the circuit board 1 (that is, the lower surface of the first wiring structure body 10) and an upper surface of the circuit board 2, and bonds the circuit board 1 to the circuit board 2 under a state in which a part of a side surface of the circuit board 1 is covered. Here, as described above, the end surface 41a of the electrode pad 40 (the first conductor layer 41) and the lower surface of the first wiring structure body 10 are positioned on the same plane. With this, the thickness of the adhesive layer 30 formed on the lower surface of the first wiring structure body 10 can be formed evenly. Thus, when the circuit board 1 is bonded to the circuit board 2, the adhesive layer 30 is evenly pushed outward from the lower surface of the first wiring structure body 10, and is prevented from remaining on the end surface 41a of the electrode pad 40. As a result, biting of the adhesive layer 30 between the electrode pad 40 being a connection terminal of the circuit board 1 and the electrode pad 71 being a connection terminal of the circuit board 2 is prevented, and hence connection reliability of the electrode pad 40 can be improved.

According to one aspect of the circuit board disclosed in the present application, an effect of improving fixing strength of the electrode pad with respect to the insulating layer can be exerted.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A circuit board, comprising:
   an insulating layer having at least a part formed of an insulating resin;
   an electrode pad embedded in the insulating layer and having a neck formed on an outer side surface, the neck being held in contact with the insulating resin of the insulating layer; and
   a via embedded in the insulating layer and connected to the electrode pad,
   wherein
   the electrode pad includes:
      a first conductor layer having an end surface exposed from one surface of the insulating layer; and
      a second conductor layer formed on the first conductor layer and having a grain boundary density different from a grain boundary density of the first conductor layer,
   the neck is formed in a region of the outer side surface, the region corresponding to a boundary part between the first conductor layer and the second conductor layer, and
   a surface of the via on a side opposite to the electrode pad is exposed from the insulating layer and is flush with a surface of the insulating layer opposite to the one surface of the insulating layer from which the end surface of the first conductor layer is exposed.

2. The circuit board according to claim 1, wherein the second conductor layer has a grain boundary density smaller than the grain boundary density of the first conductor layer.

3. The circuit board according to claim 1, wherein
   the end surface of the first conductor layer that is exposed from the one surface of the insulating layer is flush with the one surface of the insulating layer, and
   an adhesive layer for bonding the circuit board to another circuit board is formed on the one surface of the insulating layer.

4. The circuit board according to claim 1, wherein
the insulating layer includes:
- a first insulating layer formed of insulating resin;
- a second insulating layer laminated on the first insulating layer and formed of insulating resin and a reinforcing member; and
- a third insulating layer laminated on the second insulating layer and formed of insulating resin, a side surface of the via is covered by the second insulating layer and the third insulating layer, and
the surface of the via on the side opposite to the electrode pad is exposed from the third insulating layer.

5. A circuit board, comprising:
an insulating layer having at least a part formed of an insulating resin; and
an electrode pad embedded in the insulating layer and having a neck formed on an outer side surface, the neck being held in contact with the insulating resin of the insulating layer,
wherein
the electrode pad includes:
- a first conductor layer having an end surface exposed from one surface of the insulating layer; and
- a second conductor layer formed on the first conductor layer and having a grain boundary density different from a grain boundary density of the first conductor layer, the neck is formed in a region of the outer side surface, the region corresponding to a boundary part between the first conductor layer and the second conductor layer,
the insulating layer includes:
- a first insulating layer formed of insulating resin; and
- a second insulating layer laminated on the first insulating layer and formed of insulating resin and a reinforcing member, the electrode pad is embedded in the first insulating layer and the second insulating layer, and
the neck is held in contact with the insulating resin of the first insulating layer.

6. A laminated circuit board, comprising:
another circuit board; and
the circuit board according to claim 1, the circuit board being mounted on the another circuit board, wherein
the electrode pad is joined to an electrode pad of the another circuit board.

* * * * *